United States Patent
Ho et al.

(10) Patent No.: US 9,805,154 B2
(45) Date of Patent: Oct. 31, 2017

(54) METHOD OF LITHOGRAPHY PROCESS WITH INSERTING SCATTERING BARS

(71) Applicant: Taiwan Semiconductor Manufacturing Company, Ltd., Hsin-Chu (TW)

(72) Inventors: Irene Ho, Taichung (TW); Ai-Jen Hung, Nantou County (TW); Hung-Chang Hsieh, Hsin-Chu (TW); Kuei-Liang Lu, Hsinchu (TW); Ya Hui Chang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 205 days.

(21) Appl. No.: 14/713,360

(22) Filed: May 15, 2015

(65) Prior Publication Data

US 2016/0335385 A1    Nov. 17, 2016

(51) Int. Cl.
| | | |
|---|---|---|
| G06F 17/50 | (2006.01) | |
| G03F 1/00 | (2012.01) | |
| G03F 7/00 | (2006.01) | |
| G03F 1/36 | (2012.01) | |
| G03F 7/20 | (2006.01) | |

(52) U.S. Cl.
CPC .......... *G06F 17/5072* (2013.01); *G03F 1/144* (2013.01); *G03F 1/36* (2013.01); *G03F 7/70441* (2013.01); *G03F 7/70433* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 6,238,825 B1 * | 5/2001 | Lin | ............................ | G03F 1/26 |
| | | | | 430/5 |
| 6,329,107 B1 * | 12/2001 | Lu | ........................ | G03F 7/70441 |
| | | | | 430/30 |
| 7,247,574 B2 | 7/2007 | Broeke et al. | | |
| 8,037,429 B2 | 10/2011 | Shang | | |
| 8,527,916 B1 | 9/2013 | Chiang et al. | | |
| 8,572,520 B2 | 10/2013 | Chou et al. | | |
| 8,589,828 B2 | 11/2013 | Lee et al. | | |
| 8,589,830 B2 | 11/2013 | Chang et al. | | |

(Continued)

FOREIGN PATENT DOCUMENTS

| | | |
|---|---|---|
| TW | 200813768 | 3/2008 |
| TW | 200619863 | 6/2016 |

OTHER PUBLICATIONS

A. Fujimra et al., "Writing 32nm-hp Contacts with Curvilinear Assist Features," Photomask Technology 2010, Proc. of Spie vol. 7823, 8 pages.*

(Continued)

*Primary Examiner* — Leigh Garbowski
(74) *Attorney, Agent, or Firm* — Haynes and Boone, LLP

(57) ABSTRACT

The present disclosure provides one embodiment of an IC method that includes receiving an IC design layout including a first main feature and inserting a first plurality of scattering bars in the IC design layout to form a first circular pattern of scattering bars around the first main feature. The first main feature is positioned at a center portion of the first circular pattern of scattering bars.

20 Claims, 9 Drawing Sheets

(56) References Cited

U.S. PATENT DOCUMENTS

| | | | |
|---|---|---|---|
| 8,627,241 B2 | 1/2014 | Wang et al. | |
| 8,631,360 B2 | 1/2014 | Wang et al. | |
| 8,631,361 B2 | 1/2014 | Feng | |
| 8,732,626 B2 | 5/2014 | Liu et al. | |
| 8,739,080 B1 | 5/2014 | Tsai et al. | |
| 8,745,550 B2 | 6/2014 | Cheng et al. | |
| 8,751,976 B2 | 6/2014 | Tsai et al. | |
| 8,762,900 B2 | 6/2014 | Shin et al. | |
| 8,812,999 B2 | 8/2014 | Liu et al. | |
| 8,850,366 B2 | 9/2014 | Liu et al. | |
| 9,208,275 B2 * | 12/2015 | Wang | G06F 17/5068 |
| 2010/0325591 A1 * | 12/2010 | Lippincott | G06F 17/5072 716/54 |
| 2013/0267047 A1 | 10/2013 | Shih et al. | |
| 2014/0101624 A1 | 4/2014 | Wu et al. | |
| 2014/0109026 A1 | 4/2014 | Wang et al. | |
| 2014/0120459 A1 | 5/2014 | Liu et al. | |
| 2014/0282334 A1 | 9/2014 | Hu et al. | |

OTHER PUBLICATIONS

B. Morgenfeld et al., "Escaping death: single-patterning contact printing for 32/28-nm logic technology nodes," J. Micro/Nanolith. MEMS MOEMS 11(1), 013010 (Jan.-Mar. 2012), 13 pages.*

M.L.Ling et al., "Radial segmentation approach for contact hole patterning in 193 nm immersion lithography," Optical Microlithography XXIII, Proc. of SPIE vol. 7640, 2010, 12 pages.*

A. Latypov et al., "Improving the lithographic process windo using directed self-assembly-aware printing assist features," J.Micro/Nanolith. MEMS MOEMS 14(3), 031213 (Jul.-Sep. 2015), 10 pages.*

A.Fujimura et al.,"Improvement of Mask Write Time for Curvilinear Assist Features at 22nm," Photomask Technology 2010, Proc. of SPIE vol. 7823, 10 pages.*

Y. Granik, "Fast pixel-based mask optimization for inverse lithography," J. Microlith., Microfab., Microsyst. 5(4) 043002 (Oct.-Dec. 2006) 13 pages.*

* cited by examiner

METHOD OF LITHOGRAPHY PROCESS WITH INSERTING SCATTERING BARS

BACKGROUND

The semiconductor integrated circuit (IC) industry has experienced exponential growth. Technological advances in IC design and material have produced generations of ICs where each generation has scaled down to smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, improvements to the IC design layout are needed.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
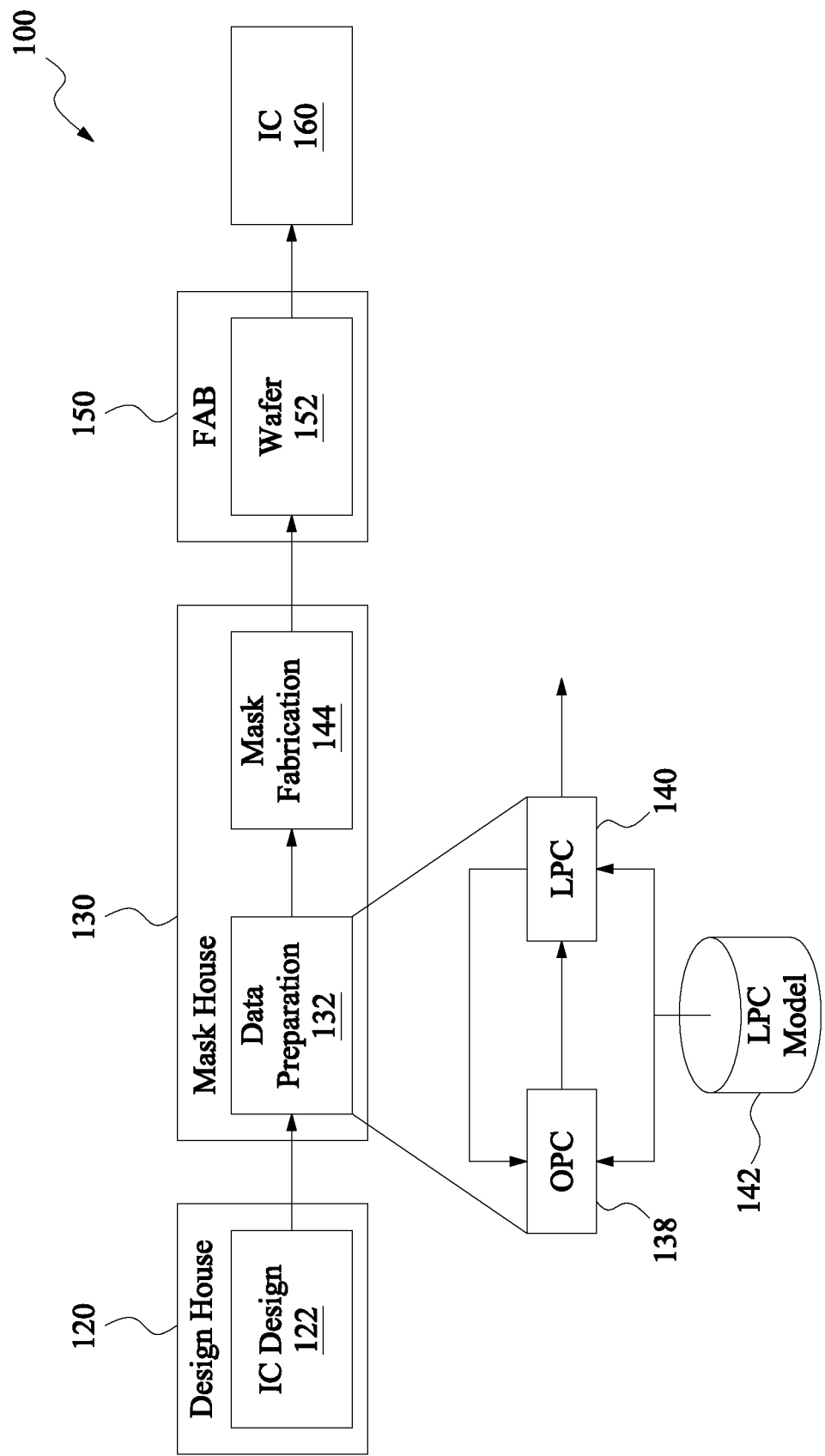
FIG. 1 is a simplified block diagram of an embodiment of an integrated circuit (IC) manufacturing system and an associated IC manufacturing flow.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns (features) designed for an IC product, based on a specification of the IC product to be manufactured. The geometrical patterns correspond to patterns of materials that make up the various components of the IC device 160 to be fabricated. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information about the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132 and mask fabrication 144. Mask data preparation 132 involves the IC design layout 122 being translated into a form that can be physically written by a mask writer. Mask fabrication 144 involves using the design layout prepared by the mask data preparation 132 being modified to comply with a particular mask writer and/or mask manufacturer and then subsequently fabricating the mask. In the present embodiment, the mask data preparation 132 and mask fabrication 144 are illustrated as separate elements, however, the mask data preparation 132 and mask fabrication 144 can be considered one element that is collectively referred to as a mask data preparation element.

The mask data preparation 132 may include an optical proximity correction process (OPC) 138 and a lithography process check process (LPC) 140. The OPC 138 is a lithography enhancement technique used to compensate for image errors, such as those that can arise from diffraction, interference, and/or other process effects. OPC 138 may add features, such as scattering bars (SBs), serif, and/or hammerheads to the IC design layout 122 according to optical models and/or rules such that, after a lithography process, a final pattern on a wafer is improved with enhanced resolution and precision. The mask data preparation 132 according to an illustrated embodiment is described in greater detail below. The mask data preparation 132 also includes further resolution enhancement techniques, such as off-axis illumination, sub-resolution assist features, phase-shifting masks, other suitable techniques, and/or combinations thereof.

The LPC 140 simulates processing that will be implemented by the IC manufacturer 150 to fabricate the IC device 160. The LPC 140 simulates this processing based on the IC design layout 122 to create a simulated manufactured device, such as the IC device 160. The simulated manufactured device includes simulated contours of a portion and/or the entire IC design layout. In the present embodiment, the LPC 140 simulates processing of the modified IC design layout, which has been subjected to the OPC 138. The LPC 140 uses one or more LPC models (or rules) 142. The LPC models 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity in the form of a mask error enhancement factor ("MEEF"), other suitable factors, and/or combinations thereof.

After a simulated (or virtual) device has been created by the LPC 140, if the simulated device is not close enough in shape to satisfy design rules, certain steps in the mask data preparation 132, such as OPC 138, may be repeated to refine the IC design layout 122 further. It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during data preparation 132 may be executed in a variety of different orders.

During mask fabrication 144, a mask and/or a group of masks are fabricated based on the modified IC design layout. For example, an electron-beam (e-beam) and/or a mechanism of multiple e-beams is used as an exposure source to form a pattern on a mask (photomask or reticle) based on the modified IC design layout. The IC manufacturer 150 uses the mask (or masks) fabricated by the mask house 130 to transfer the IC design to a semiconductor substrate 152, such as a wafer, to form the IC device 160.

Figure 2:
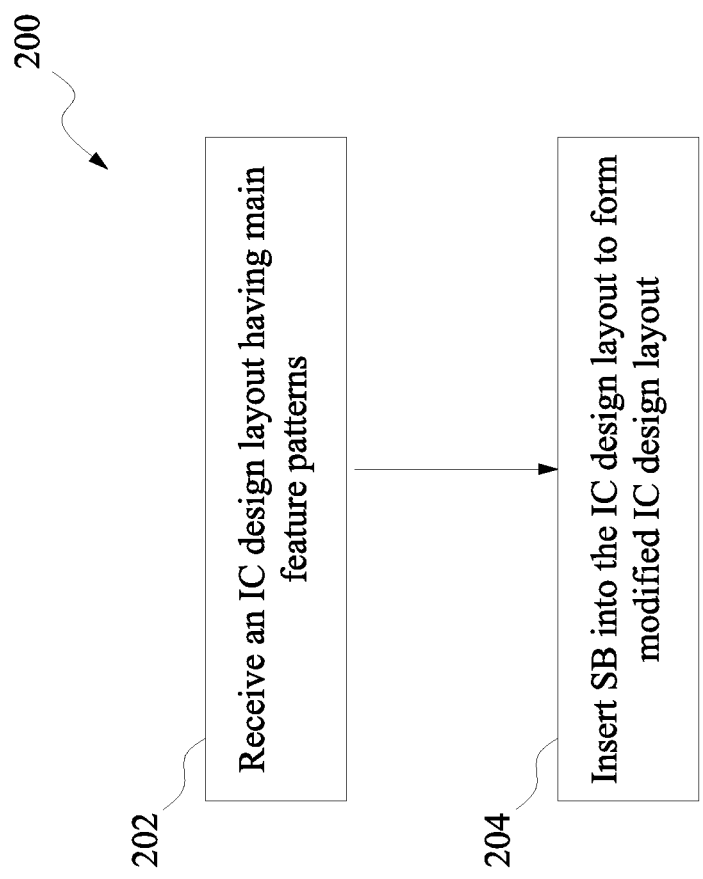
FIG. 2 is a flowchart of an embodiment of an integrated circuit (IC) method constructed in accordance with some embodiments.

FIG. 2 is a flowchart of the method 200 of modifying an IC design layout before mask fabrication according to various aspects of the present disclosure. In one embodiment, the method 200 may be implemented in the mask data preparation 132 of mask house 130 shown in FIG. 1. Further, the method 200 in FIG. 2 is an overview and details associated with each step in the method will be described in association with the subsequent figures in the present disclosure.

Figure 3:
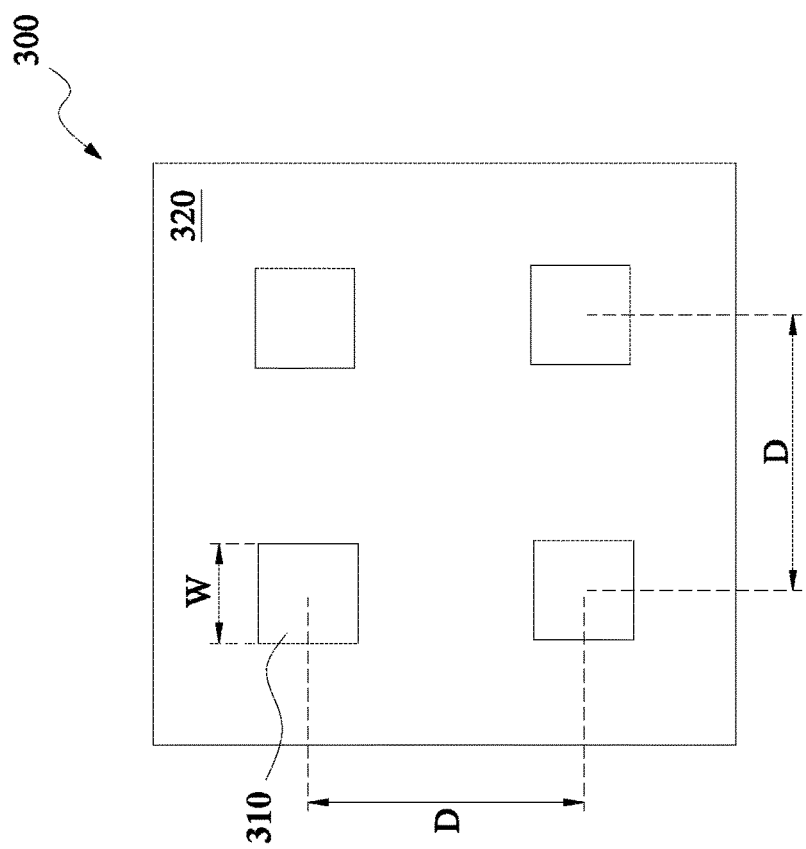

Referring to FIGS. 2 and 3, the method 200 begins at step 202 by receiving an IC design layout 300. The IC design layout 300 is presented in one or more data files having the information of the geometrical patterns. In one example, the IC design layout 300 is expressed in a GDS file format. In alternative embodiments, the IC design layout 300 may be transmitted between the components in IC manufacturing system 100 in alternate file formats such as DFII, CIF, OASIS, and/or any other suitable file type. The IC design layout 300 includes various geometrical patterns representing features of an integrated circuit. For example, the IC design layout 300 may include a plurality of main features 310 such as active regions, gate electrodes, sources and drains, metal lines, interlayer interconnection vias, openings for bonding pads that may be formed in a semiconductor substrate (such as a silicon wafer) and/or various material layers disposed over the semiconductor substrate. The IC design layout 300 also includes a background region 320 without main features. The IC design layout 300 may also include certain assist features, such as those features for imaging effect, processing enhancement, and/or mask identification information.

In the present embodiment, the main features 310 include a plurality of square-shape main features 310. In some embodiments, each of the main features 310 has a same width. In some embodiments, main features 310 have different widths. In some embodiments, a distance D between each of two adjacent main features 310 is same. In some embodiments, the distance D varies among the main feature 310.

Usually, an optical proximity correction process (OPC) is applied to the IC design layout 300 to compensate for distortions caused by diffraction of radiation that occurs during the use of the lithography tools. The OPC process may include applying features that will alter the photomask, such as adding sub-resolution features to the photomask that interact with the original patterns in the physical design, adding features to the original patterns such as "serifs," adding jogs to features in the original pattern, modifying main feature pattern shapes or edges, and/or other enhancements. As process nodes shrink, OPC processes and the resultant patterns become more complex. Although existing OPC processes have been generally adequate for their intended purposes, they have not been entirely satisfactory in all respects. For example, one type of advanced OPC process is inverse lithography technology (ILT). ILT includes simulating the optical lithography process in the reverse direction, using the desired pattern on the substrate as an input to the simulations. The ILT process may produce complex, non-linear patterns that can be difficult, time consuming, and/or costly to form on a photomask or reticle. For another example, another type of advanced OPC process is adding scattering bars (SBs) to the IC design layout, but doing so induces focus shifting. The present disclosure provides an OPC process that includes inserting SBs with an arrangement that reduces focus shifting in comparison to previous attempts involving the insertion of SBs.

Figure 4A:
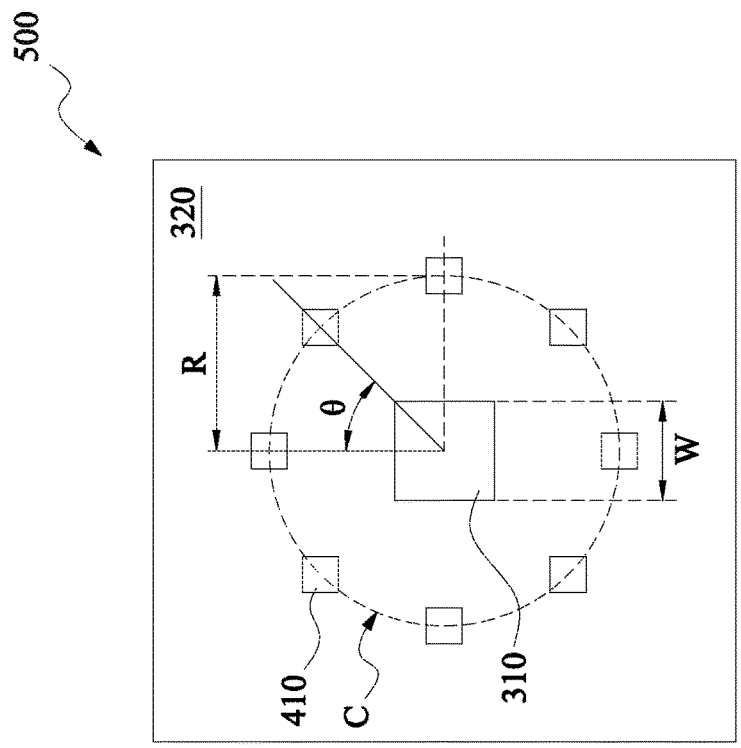
FIGS. 3 and 4A-4G illustrate an integrated circuit (IC) design layout constructed in accordance with some embodiments.

Referring to FIGS. 2 and 4A, the method 200 proceeds to step 204 by inserting a plurality of scattering bars (SBs) 410 in an eight-scattering bars-on-a-circle (ESBoC) arrangement into the IC design layout 300 to form a modified IC design layout 500. SBs 410 are sub-resolution assist features (SRAF) that are placed in the background region 320 adjacent to main features 310. A plurality of SBs 410 are utilized to modify the shape of main features 310 to compensate for diffraction and/or other process effects in an lithography process, so that the shape of the main features 310 as formed in the final integrated circuit more closely matches the shape of the main features in the IC design layout 300.

In the present embodiment, a respective ESBoC arrangement is assigned to each of the main features 310. In this example, the total number of SBs of each ESBoC arrangement is equal to N×8, where N is an integer.

In other examples, a given SB 410 may be part of (i.e. assigned to) more than one ESBoC arrangement. That is, as shown and discussed below in FIGS. 4B-4F below, one or more SBs 410 from one ESBoC arrangement around a first main feature are also part of another ESBoC arrangement around a second main feature. In other words, a subgroup of SBs 410 from one or more ESBoC arrangements can be assigned together to form another ESBoC arrangement. As discussed above, each ESBoC arrangement includes eight SBs and this is true even when SBs 410 from one or more ESBoC arrangements are assigned together to form another ESBoC arrangement. Thus, by utilizing subgroups of SBs to form additional ESBoC arrangements, the total number of SBs inserted into a design layout can be reduced.

Each individual SB 410 can have a square-shape, rectangular shape, and/or any other suitable shape. As shown in FIG. 4A, each SB 410 in an ESBoC arrangement is positioned uniformly around main feature 310 in a circular pattern C. In other words, the SBs 410 in the ESBoC arrangement form a circular pattern around the respective main feature 310, wherein the main feature 310 is positioned at a center portion of the circular pattern of SBs 410. The circle C of SBs 410 has a radius R. A central angle θ between each of two adjacent SBs 410 in the SB circle C is equal to 360/(N×8) degree. For example, when N is equal to 1, each of the subgroup has eight SBs 410 and the central angle θ is equal to 45 degree.

Figure 4B:
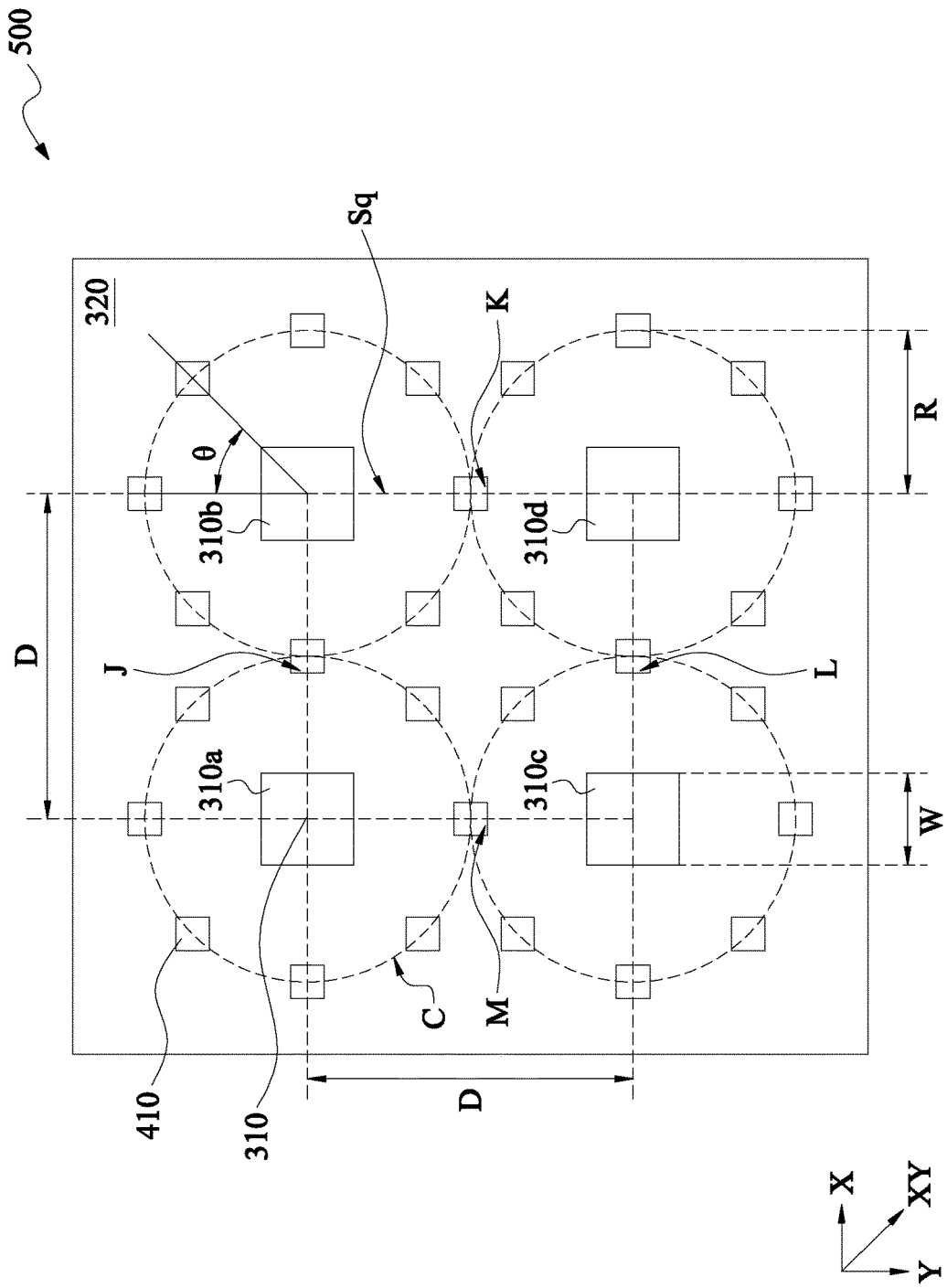

Referring to FIG. 4B, main features 310 have a square-shape and have a same width w. Main features 310a, 310b, 310c and 310d, form a square Sq with a length being equal to the distance D. In other words, along X direction, next to the main feature 310a is the main feature 310b; along Y direction, next to the main feature 310a is the main feature 310c; along X direction, next to the main feature 310c is the main feature 310d. A distance between main features 310a and 310b, or between 310a and 310c, or between 310c and 310d, is equal to the distance D. The distance D is in a range from greater than two times of the width w of the main feature 310 to less than six times of the width w of the main feature 310. For example, each of subgroup SBs 410 forming a given ESBoC is formed of eight SB 410s and has a central angle θ is 45 degree.

As shown in FIG. 4B, in this embodiment, all SB 410s have the same shape and size and are positioned similarly in the respective circles C around a given main feature. In this embodiment, all circles C have the same radius R, which is in a range from greater than the width w of the main feature 310 to less than 3.5 times of the width w. An area of the SB 410 is in a range of 0.1 A to 0.5 A, here A is an area of the main feature 310. Here, when the radius R is chosen to be equal to half of the distance D, two adjacent SB circles C, along X direction or Y direction, overlap at a location such as J, K, L, M, shown in FIG. 4B. Thus, when the SB 410 is positioned in locations of J, K, L, M, it is shared by two respective main features 310.

Figure 4C:
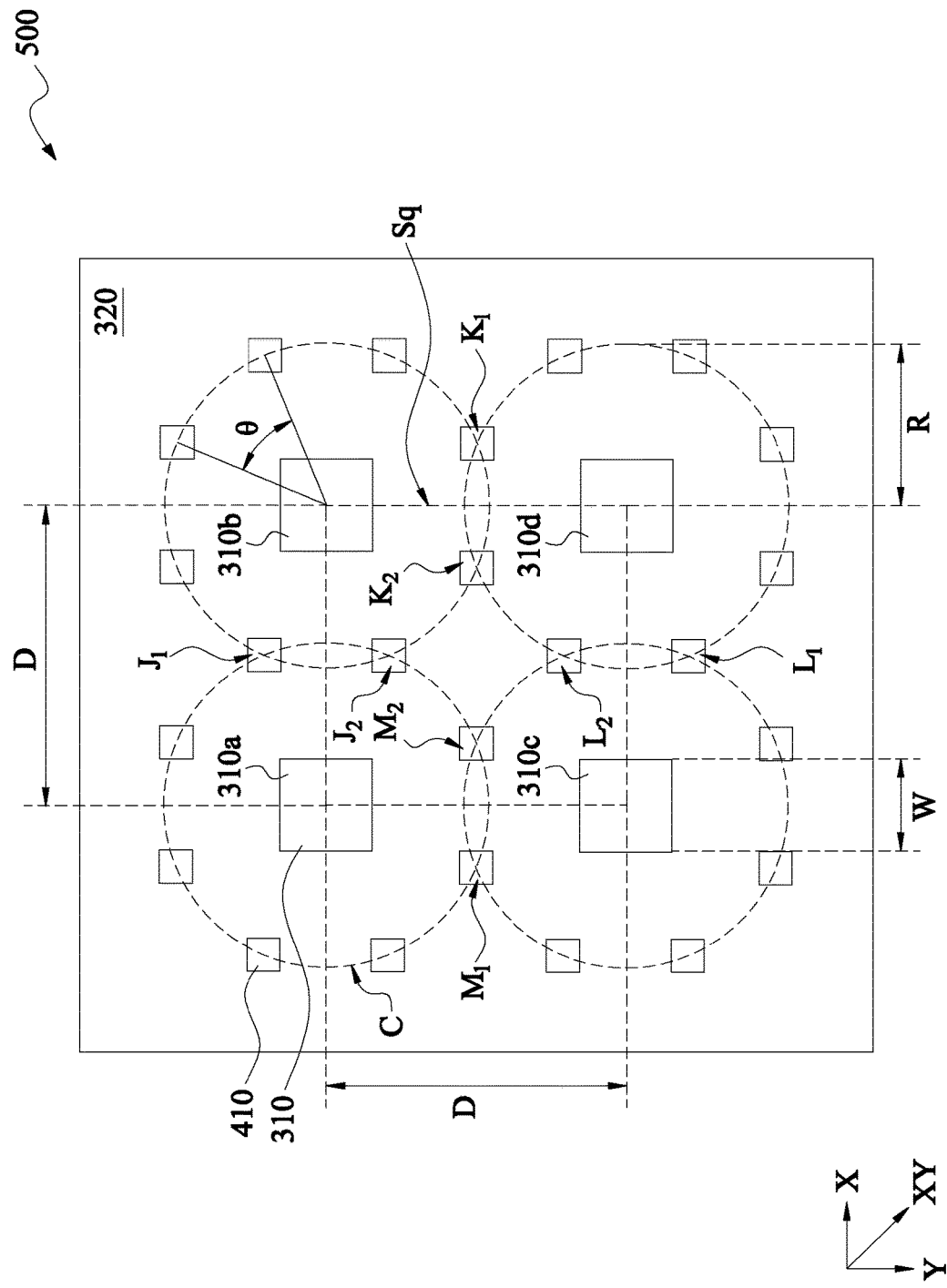

FIG. 4C is similar to FIG. 4B except as described differently below. Specifically, FIG. 4C illustrates that when the radius R is chosen to be greater than a half of the distance D, two adjacent SB circles C, along X direction or Y direction, overlap at two locations such as $J_1$ and $J_2$, or $K_1$ and $K_2$, or $L_1$ and $L_2$, or $M_1$ and $M_2$. Thus, when the SB 410 is positioned in these locations, it is shared by two respective main features 310.

Figure 4D:
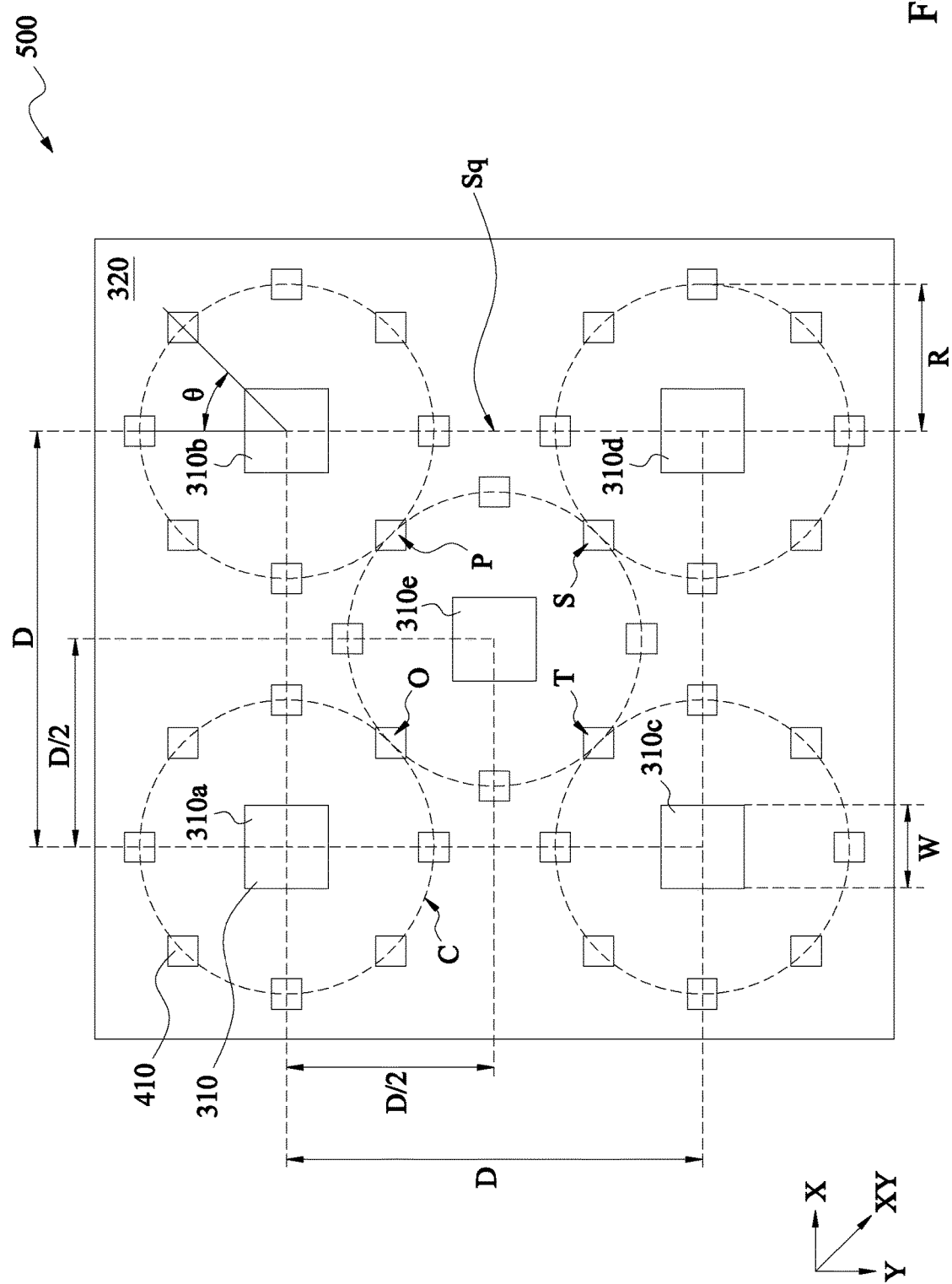

Referring to FIG. 4D, main features 310 have a square-shape and have a same width w. In that regard, main features, 310a, 310b, 310c and 310d, form the square Sq with the length being equal to the distance D and has the main feature 310e at the center of the square Sq. In other words, along X direction, next to the main feature 310a is the main feature 310b; along Y direction, next to the main feature 310a is the main feature 310c; along X direction, next to the main feature 310c is the main feature 310d and the main feature 310e is in the center of the square Sq formed by 310a, 310b, 310c and 310-d. A distance between main features 310a and 310b, or between 310a and 310c, is equal to the distance D. The distance D is in a range from greater than two times of the width w of the main feature 310 to less than six times of the width w of the main feature 310. For example, each of subgroup SBs 410 forming a given ESBoC is formed of eight SB 410s and has a central angle θ is 45 degree.

As shown in FIG. 4B, in this embodiment, all SB 410s have the same shape and size and are positioned similarly in the respective circles C. Here, all circles C have the same radius R, which is in a range from greater than the width w of the main feature 310 to less than 3.5 times of the width w of the main feature 310. An area of the SB 410 is in a range of 0.1 A to 0.5 A, here A is an area of the main feature 310.

When the radius R is chosen to be equal to a half of a distance between the main features 310a and 310e, two adjacent SB circles C of main features 310a and 310e, 310b and 310e, 310c and 310e, 310d and 310e, overlap at locations of O, P, S, T, respectively, shown in FIG. 4D. Thus, when a SB 410 is positioned in each of these locations, it is shared by two respective main features 310.

Figure 4E:
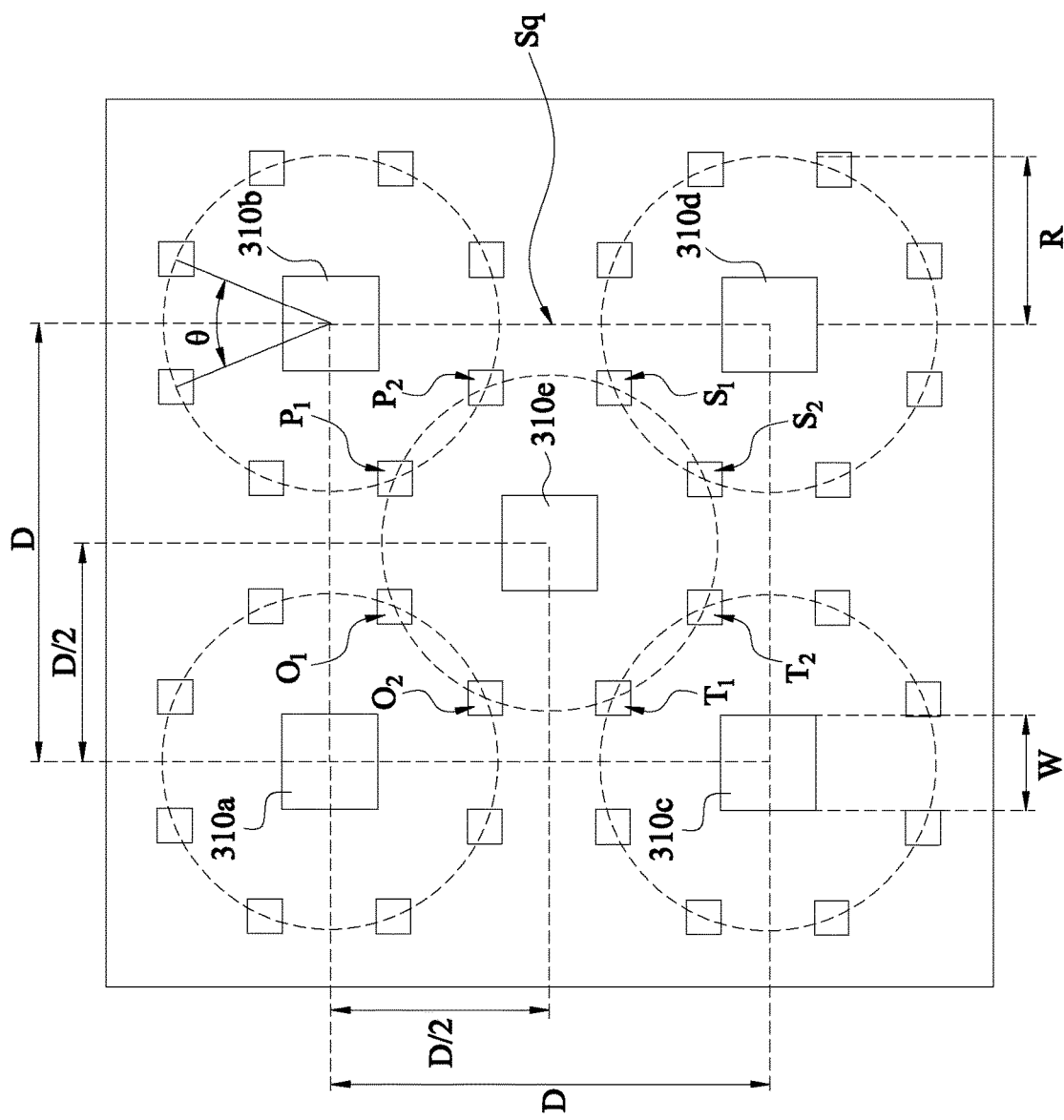

FIG. 4E is similar to FIG. 4D except as described differently below. Specifically, FIG. 4E illustrates that when the radius R is chosen to be greater than a half of a distance between the main features 310a and 310e, two adjacent circles C of SBs around main features 310a and 310e, 310b and 310e, 310c and 310e, 310d and 310e, overlap at locations of $O_1$, $O_2$, $P_1$, $P_2$, $S_1$, $S_2$, $T_1$, $T_2$, shown in FIG. 4E. Thus, when the SB 410 is positioned in each of these locations, it is shared by two respective main features 310.

Figure 4F:
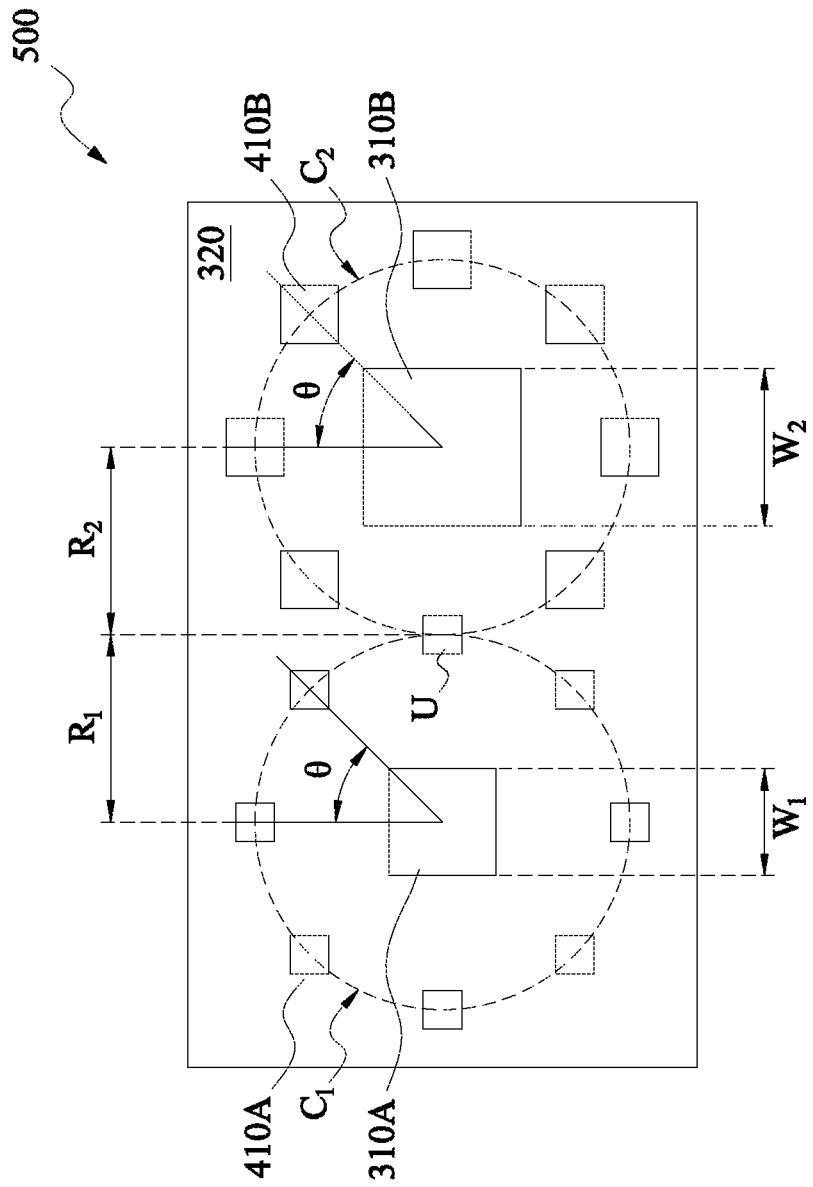

Referring to FIG. 4F, in some embodiments, adjacent main features 310 have a same square-shape but different width, such as a first main feature 310A has a first width $w_1$ while a second main feature 310B has a second width $w_2$, which is greater than the first width $w_1$. Thus, the first main feature 310A has a first area $(w_1)^2$ and the second main feature 310B has a second area $(w_2)^2$ and a ratio of the second area $(w_2)^2$ to the first area $(w_1)^2$ is greater than 1.0 but less than 1.8. The distance D is in a range from greater than two times of the first width $w_1$ to less than seven times of the first width $w_1$.

A first subgroup of the SB 410, SB 410A, is positioned in a first circle $C_1$ and a second subgroup of the SB 410, SB 410B, is positioned in a second circle $C_2$, such that the first SBs 410A are positioned similarly in the first circle $C_1$ with respect to the second SBs 410B in the second SB circle $C_2$. The first circle $C_1$ has a first radius $R_1$ and the second SB circle has a second radius $R_2$. The second SB 410B has a similar same shape (i.e. square), but different size as compared to the first SB 410A. The first SB 410A has a third area $A_3$ and the second SB 410B has a fourth area $A_4$. Here, the fourth area $A_4$ is greater than the third area $A_3$, For example, a ratio of the fourth area $A_4$ to the third area $A_3$ is in a range of greater than 1 to less than 1.5. A range of the third area and the fourth area is in such way that: $0.1(w_1)^2 < A_3 < A_4 < 0.4(w_1)^2$. In other embodiments, the fourth area $A_4$ is same as the third area $A_3$.

Here, the second radius $R_2$ is chosen to be the same as the first radius $R_1$. In the present embodiment, when the first and second circles, $C_1$ and $C_2$, overlap at a single location U (shown as FIG. 4F), the SB 410 at the location U is shared by the first main feature 310A and the second main feature 310B.

Figure 4G:
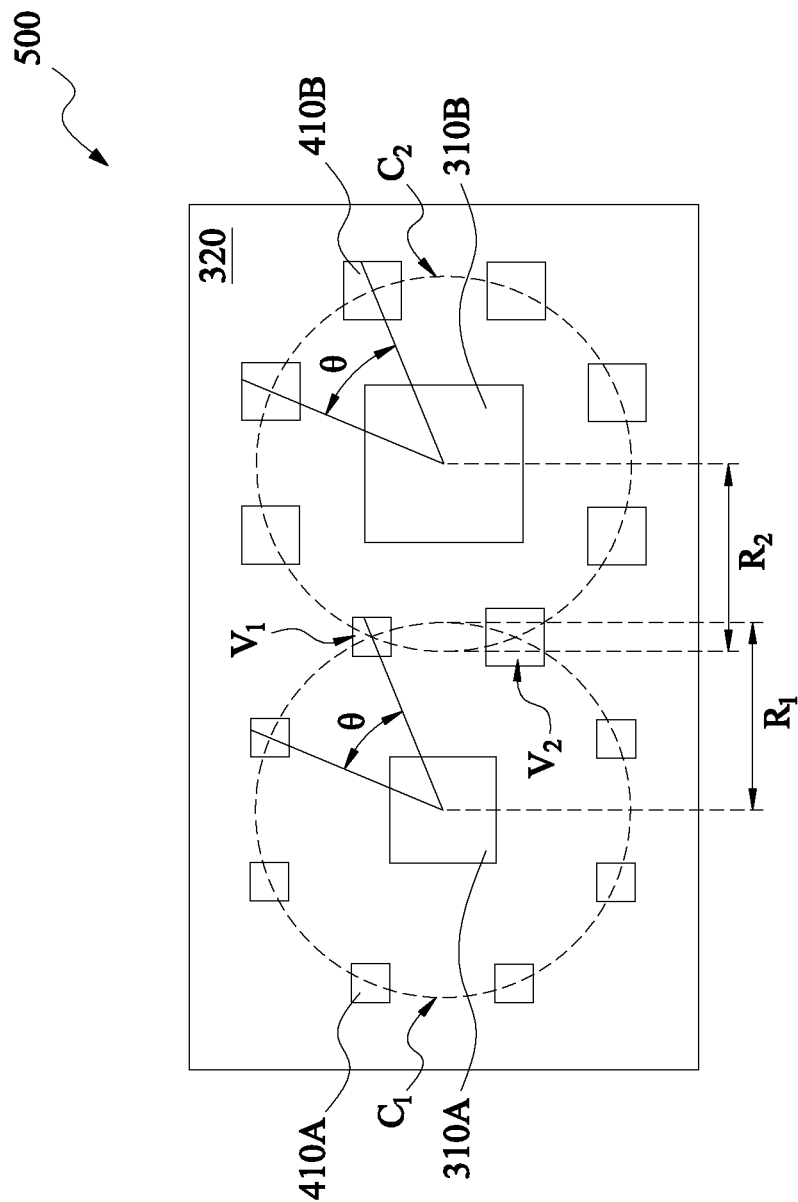

FIG. 4G is similar to FIG. 4F except as described differently below. Here, the second radius $R_2$ is chosen to be greater than the first radius $R_1$, such that $1.3w_1 < R_1 < R_2 < 5.5w_1$. When the first and second circles, $C_1$ and $C_2$, overlap at the location $V_1$ and $V_2$ (shown as FIG. 4G) the respective SBs 410 at these positions are shared by the first main feature 310A and the second main feature 310B.

Additional steps can be provided before, during, and after the method 200, and some of the steps described can be replaced, eliminated, or moved around for additional embodiments of the method 200.

For example, after forming the modified IC design layout 500, it is provided to a mask writer. In one embodiment, the modified IC design layout 500 is provided in a mask writer format, such as a machine readable format. In another embodiment, one or more aspects of the design data is provided in a MEBES database format. The data provided to and/or used by the mask writer may be stored on a non-transitory storage medium. The mask writer may be an e-beam mask writer. In one embodiment, the e-beam mask writer is a multi-beam e-beam writer. Other exemplary e-beam writers include variable shaped beam writers, Gaussian beam, character projection, and/or other suitable e-beam writer tools. In other embodiments, the mask writer may be a laser writer.

For another example, after mask writer receives the modification design layout 500, it is used in a mask fabrication to form a geometric pattern corresponding to the modification design layout 500 on a mask. The mask writer, such as an e-beam writer, projects one or more beams of electrons through a stencil onto the mask (blank having a photosensitive layer) to form a mask image reflecting the patterns on the modification design layout 500 layout. It is noted that some features of the modification design layout 500, such as the SBs 410, may be sub-resolution. Thus, though they are formed on the photomask, they are not formed on the target substrate during the imaging.

The mask fabricated may include a substrate upon which patterns are etched and/or materials disposed thereon are patterned to reflect the modification design layout 500. The mask may be a binary mask, a phase shift mask (PSM), an extreme ultraviolet lithograph (EUVL) mask, and/or other suitable mask. In an embodiment, the mask includes transparent substrate (e.g., quartz) and an opaque material (e.g., chromium). Exemplary PSM may include attenuated PSM, alternating PMS, and/or other phase shift mask technologies. Exemplary EUL masks may include a substrate (e.g., quartz, a low-thermal expansion material (LTEM)) having various multilayers and absorption layers formed thereon.

Based on the above, the present disclosure offers a method for modifying IC design layout by inserting scattering bars. The method employs an ESBoC arrangement in inserting scattering bars. The method demonstrates improving DOF, SB printing out window and reducing focus shifting. The method provides a robust OPC process.

Thus, the present disclosure provides one embodiment of an integrated circuit (IC) method. The IC method includes receiving an IC design layout including a first main feature and inserting a first plurality of scattering bars in the IC design layout to form a first circular pattern of scattering bars around the first main feature. The first main feature is positioned at a center portion of the first circular pattern of scattering bars.

The present disclosure provides another embodiment of an IC method. The method includes receiving an IC design layout including a plurality of main features and inserting a plurality of scattering bar (SB)s in the IC design layout. Each of the main feature is surrounded by a subgroup of the SBs and each subgroup has 8N of the SB (here N is an integer). Each of the SB is positioned uniformly along a circle with the respective main feature as its center. The SBs in different subgroups are positioned in a similar position in the respective circles. The scattering bars have a same central angle between two adjacent SBs, which is equal to bout (360)/(8N), where N is an integer.

The present disclosure also provides another embodiment of an IC method. The method includes receiving an IC design layout including a first main feature and a second main feature. The first main feature and a second main feature have a same shape. The method also includes inserting a first subgroup of scattering bar (SB)s in the IC design layout. The first subgroup of the SBs is positioned uniformly along a first circle with the first main feature in its center. The method also includes inserting a second subgroup of the SBs in the IC design layout. The second subgroup of the SBs is positioned uniformly along a second circle with the first main feature in its center. Each of subgroup has 8N of the SB (here N is an integer). The SBs in the first subgroup are positioned in the first circle in a similar position as the SBs in the second subgroup in the second circle.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   receiving an integrated circuit (IC) design layout including a first main feature and a second main feature; and
   inserting a first plurality of scattering bars in the IC design layout to form a first circular pattern of scattering bars around the first main feature, wherein the first main feature is positioned at a center portion of the first circular pattern of scattering bars, the first plurality having at least eight scattering bars;
   inserting a second plurality of scattering bars in the IC design layout to form a second circular pattern of scattering bars around the second main feature, wherein the second main feature is positioned at a center portion of the second circular pattern of scattering bars, the second plurality having at least eight scattering bars, wherein a single scattering bar is shared between the first plurality of scattering bars and the second plurality of scattering bars; and
   fabricating a mask having the IC design layout.

2. The method of claim 1, wherein the first plurality of scattering bars is equal to M and the second plurality of scattering bars is equal to N, wherein M is a first integer and N is a second integer that is different than N.

3. The method of claim 2, wherein the scattering bars have a same central angle between two adjacent scattering bars, which is equal to about (360)/(8N), or about (360)/(8M).

4. The method of claim 1, wherein the first circular pattern of scattering bars includes eight scattering bars, and wherein the second circular pattern of scattering bars includes eight scattering bars, wherein the total number of scattering bars in the first and second circular patterns is less than sixteen scattering bars.

5. The method of claim 1, wherein scattering bars in the first plurality of scattering bars are different in size than scattering bars of the second plurality of scattering bars except for the single scattering bar that is shared between the first plurality of scattering bars and the second plurality of scattering bars.

6. A method comprising:
receiving an integrated circuit (IC) design layout including a plurality of main features; and
inserting a plurality of scattering bars in the IC design layout, wherein each of the main features is surrounded by a subgroup of the scattering bars, wherein each subgroup has 8N of the scattering bars, wherein each of the scattering bars is positioned uniformly along a circle with the respective main feature as the circle's center, wherein the scattering bars in different subgroups are positioned in a similar position in the respective circles such that a single scattering bar is shared between two of the subgroups, wherein the scattering bars have a same central angle between two adjacent SBs, which is equal to about (360)/(8N), wherein N is an integer; and
fabricating a mask having the IC design layout.

7. The method of claim 6, wherein the plurality of main features include a first main feature and a second main feature, which have a same square-shape width w, wherein a distance between the first main feature and the second main feature is in a range from about 2w to about 6w.

8. The method of claim 7, wherein:
a first subgroup of the scattering bars is positioned along a first circle with the first main feature in its center;
a second subgroup of the scattering bars is positioned along a second circle with the first main feature in its center;
a ratio of the area of SB to the area of the main feature is in a range from about 0.1 to about 0.5 and the first circle and the second circle have a same radius, which is in a range from about w to about 3.5w.

9. The method of claim 8, wherein the radius is chosen such that the first circle and the second circle share at least one SB.

10. The method of claim 7, wherein the plurality of main features has square-shapes such that:
a first main feature has a first width $w_1$ and a first area,
a second main feature has a second width $w_2$ and a second area,
a ratio of the second area to the first area is greater than 1 and less than 1.8, and
a distance between the first main feature and the second main feature is in a range of greater than $2w_1$ but less than $7w_1$.

11. The method of claim 10, wherein:
a first subgroup of the scattering bars is positioned along a first circle with the first main feature in its center;
a second subgroup of the scattering bars is positioned along a second circle with the first main feature in its center; and
the scattering bars in the first subgroup has a third area $A_3$;
the scattering bars in the second subgroup are positioned in a same shape as the scattering bars in the first subgroup and have a fourth area $A_4$, which is $0.1(w_1)^2 < A_3 < A_4 < 0.5(w_1)^2$.

12. The method of claim 11, wherein the first circle and the second circle has a same radius R, which is $w_2 < R < 3.5w_1$.

13. The method of claim 12, wherein the radius R is chosen such that the first circle and the second circle share at least one scattering bar between the first subgroup and the second group.

14. The method of claim 11, wherein the first circle has a first radius $R_1$ and the second circle has a second radius $R_2$, which is $1.3w_1 < R_1 < R_2 < 5.5w_1$.

15. The method of claim 14, wherein the first radius $R_1$ and the second radius $R_2$ are chosen wherein the radius is chosen such that the first circle and the second circle share at least one scattering bar between the first subgroup and the second group.

16. A method comprising:
receiving an integrated circuit (IC) design layout including a first main feature and a second main feature, wherein the first main feature and a second main feature have a same shape;
inserting a first subgroup of at least eight scattering bars in the IC design layout, wherein the first subgroup is positioned uniformly along a first circle with the first main feature in its center; and
inserting a second subgroup of at least eight scattering bars in the IC design layout, wherein the second subgroup is positioned uniformly along a second circle with the second main feature in its center;
wherein each of the first subgroup and the second subgroup has 8N scattering bars, wherein the scattering bars in the first subgroup are positioned in the first circle in a similar position as the scattering bars in the second subgroup in the second circle, wherein a single scattering bar is shared between the first subgroup and the second subgroup; and
fabricating a mask having the IC design layout.

17. The method of claim 16, wherein:
the first main feature and the second main feature have a same width w,
a distance between the first main feature and the second main feature is in a range from about 2w to about 6w,
a ratio of the area of the first group of scattering bars to the area of the first main feature is in a range from about 0.1 to about 0.5,
the first circle and the second circle have a same radius, which is in a range from about w to about 3.5w, and
the single scattering bar is shared by the first circle and the second circle at a location where the first circle and the second circle overlap.

18. The method of claim 16, wherein:
the first main feature has a first width $w_1$ and a first area $A_1$,
the second main feature has a second width $w_2$ and a second area $A_2$,
a ratio of $A_2$ to $A_1$ is larger than 1 and less than 1.8,
a distance between the first main feature and the second main feature is in a range of about $2w_1$ to about $7w_1$,
the scattering bars in the first subgroup has a third area $A_3$;
the scattering bars in the second subgroup has a same shape as the SB in the first subgroup but a fourth area $A_4$, which is $0.1(w_1)^2 < A_3 < A_4 < 0.5(w_1)^2$,
the first circle and the second circle has a same radius R, which is $w_2 < R < 3.5w_1$.

19. The method of claim 18, further comprising:
the first circle has a first radius $R_1$ and the second circle has a second radius $R_2$, which is $1.3w_1<R1<R_2<5.5w_1$.

20. The method of claim 16, wherein scattering bars in the first plurality of scattering bars are different in size than scattering bars of the second plurality of scattering bars except for the single scattering bar that is shared between the first plurality of scattering bars and the second plurality of scattering bars.

\* \* \* \* \*